(12) United States Patent
Rofougaran

(10) Patent No.: US 7,170,166 B2
(45) Date of Patent: Jan. 30, 2007

(54) INTEGRATED CIRCUIT GROUND SYSTEM

(75) Inventor: Ahmadreza Rofougaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 203 days.

(21) Appl. No.: 10/836,875

(22) Filed: Apr. 30, 2004

(65) Prior Publication Data

US 2005/0242429 A1 Nov. 3, 2005

(51) Int. Cl.
*H01L 23/34* (2006.01)
(52) U.S. Cl. .................. 257/728; 361/782; 343/853
(58) Field of Classification Search ................ 343/846, 343/853, 865; 330/129, 66, 126; 361/782; 257/728
See application file for complete search history.

(56) References Cited

U.S. PATENT DOCUMENTS 6,496,382 B1 * 12/2002 Ferguson et al. ........... 361/767
6,664,935 B1 * 12/2003 Thompson et al. ......... 343/860
6,798,287 B2 * 9/2004 Wu et al. .................... 330/129

* cited by examiner

*Primary Examiner*—Hoang V. Nguyen
*Assistant Examiner*—Jimmy Vu
(74) *Attorney, Agent, or Firm*—Garlick Harrison & Markison

(57) ABSTRACT

An integrated circuit ground system includes an integrated circuit (IC) ground connection, first and second IC package pins, first and second printed circuit board (PCB) pads, a PCB ground connection, and a resonant circuit. The IC ground connection is fabricated on a substrate of an integrated circuit. The first IC package pin is operably coupled to the IC ground connection via a first bond wire. The second IC package pin is operably coupled to the IC ground connection via a second bond wire. The second PCB pad is operably coupled to the second IC package pin to provide a low impedance DC ground connection for the integrated circuit to the printed circuit board. The resonant circuit is operably coupling the first IC package pin to the first PCB pad, wherein the resonant circuit is tuned to resonant with the first bond wire at high frequency range to provide a low impedance AC ground connection for the integrated circuit to the printed circuit board within the high frequency range.

26 Claims, 7 Drawing Sheets ground circuit 85 ground circuit 85

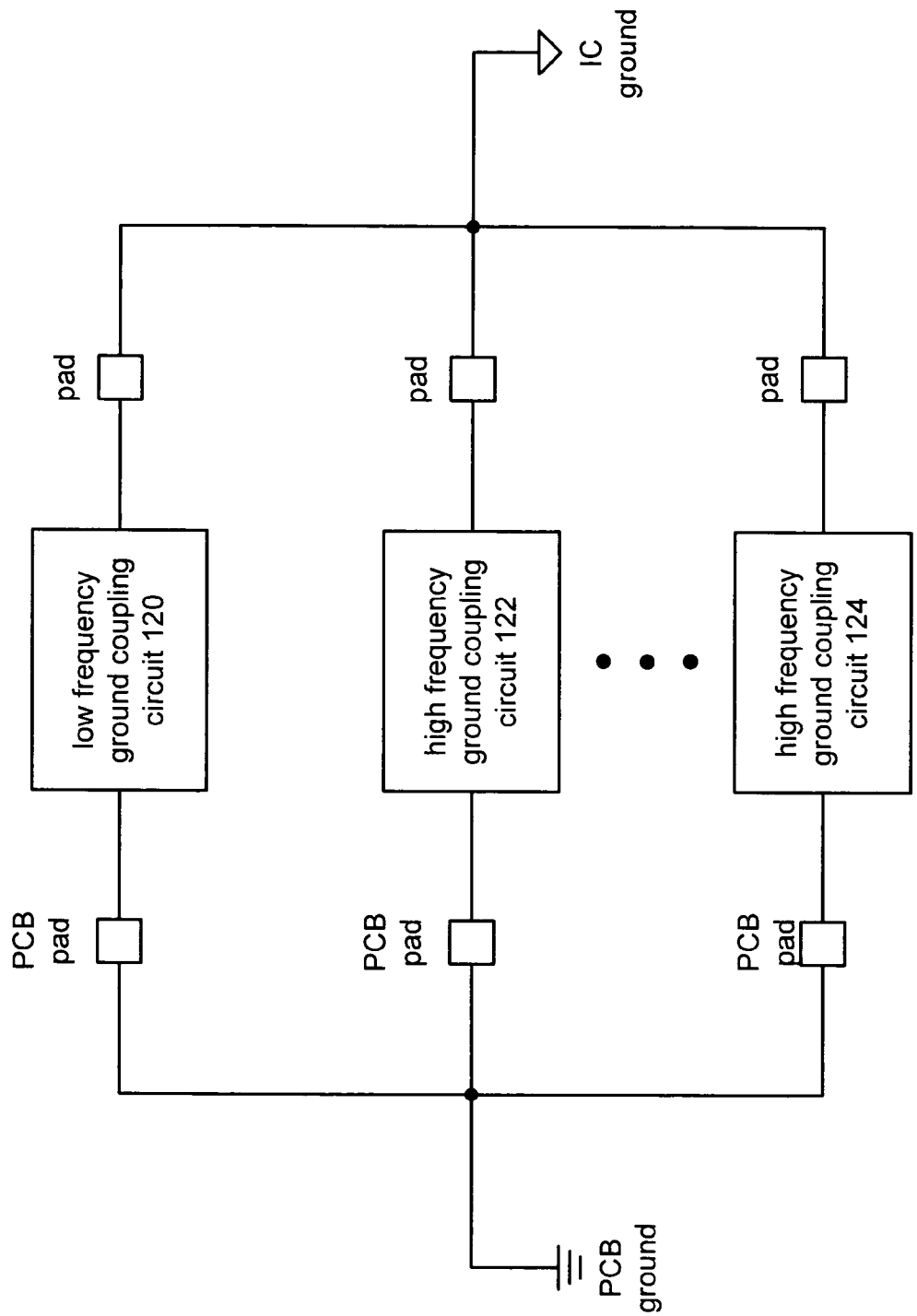

INTEGRATED CIRCUIT GROUND SYSTEM

BACKGROUND OF THE INVENTION

1. Technical Field of the Invention

This invention relates generally to high frequency signal processing and more particularly to wireless communications.

2. Description of Related Art

As is known, a good ground connection (i.e., one that provides a stable low impedance path) is an important aspect to reduce noise interferences in many analog and mixed signal circuits. In circuits that include integrated circuits (IC) and a printed circuit board (PCB), the IC must include a good internal ground connection and the PCB must also have a good ground connection. Typically, a PCB will include a ground plane and thick traces to provide its ground path.

As is further known, an IC includes a die and a package that supports the die. The die typically includes a ground plane and thick traces to provide its ground path, however, the size of the die's ground plane and thick traces will be significantly smaller than the corresponding ground connection of the PCB. The package includes a plurality of IC pins that are coupled via bond wires to input/output connections of the die, which include the ground connection. The plurality of pins is also coupled to pads on the PCB such that the circuitry of the die is operably coupled to circuitry on the PCB.

As is also known, an electrical model of a PCB trace, an IC trace, and/or a bond wire may be at least partially represented as a series resistor and a series inductor. The values of the series resistor and the series inductor are directly dependent on the thickness and length of the trace and/or wire. For instance, the resistance of the series resistor and the inductance of the series inductor decrease as the thickness of the trace or wire increases and as the length of the trace or wire decreases. Based on these physical properties of the traces and/or bond wires, the impedance is readily determined as $R+2\pi fL$, where R is the resistance of the series resistance, f is the frequency of the signal traversing the trace or wire, and L is the inductance of the series inductor.

Due to physical limitations, the thickness and length of IC traces and bond wires can only be so thick and can only be so short. Thus, as the frequency of the signals that traverse the IC traces and/or bond wires increase, the impedance of the trace and/or bond wire becomes a factor is circuit design. For instance, if a bond wire has a 2 nano Henry (nH) series inductance and the signal traversing the bond wire has a frequency of 2.4 giga Hertz (GHz), the impedance of the series inductor is $2\pi*(2.4 \text{ GHz})*(2 \text{ NH})$, which equals approximately 30 Ohms. If the bond wire is coupling a ground connection of a die to an IC pin, which, in turn, is coupled to a ground connection on the PCB, the impedance will adversely affect the performance of the circuit.

One solution to the above problem is to use multiple bond wires connected in parallel to reduce the effective series impedance. While this solution reduces the impedance at high frequencies, it requires multiple pads on the die, multiple IC pins on the package, and multiple pads on the PCB. By increasing the number of pads on the die and increases the pin count of the package, the cost of the IC will increase.

Therefore, a need exists for a grounding system that minimizes pin count and die pad connections while providing a good ground connection.

BRIEF SUMMARY OF THE INVENTION

The integrated circuit grounding system of the present invention substantially meets these needs and others. In one embodiment, an integrated circuit ground system includes an integrated circuit (IC) ground connection, first and second IC package pins, first and second printed circuit board (PCB) pads, a PCB ground connection, and a resonant circuit. The IC ground connection is fabricated on a substrate of an integrated circuit. The first IC package pin is operably coupled to the IC ground connection via a first bond wire. The second IC package pin is operably coupled to the IC ground connection via a second bond wire. The second PCB pad is operably coupled to the second IC package pin to provide a low impedance DC ground connection for the integrated circuit to the printed circuit board. The resonant circuit is operably coupling the first IC package pin to the first PCB pad, wherein the resonant circuit is tuned to resonant with the first bond wire at high frequency range to provide a low impedance AC ground connection for the integrated circuit to the printed circuit board within the high frequency range.

In another embodiment, an integrated circuit grounding system includes an IC ground connection, a PCB ground connection, a first ground coupling circuit, and a second ground coupling circuit. The IC ground connection is on a substrate of an integrated circuit and the PCB ground connection is on a layer of a printed circuit board. The first ground coupling circuit provides low impedance coupling of the IC ground connection to the PCB ground connection at low frequencies. The second ground coupling circuit provides low impedance coupling of the IC ground connection to the PCB ground connection at a high frequency band region.

BRIEF DESCRIPTION OF THE SEVERAL VIEWS OF THE DRAWINGS

FIG. 7 is a schematic block diagram of yet another embodiment of a ground circuit in accordance with the present invention.

DETAILED DESCRIPTION OF THE INVENTION

Figure 1:
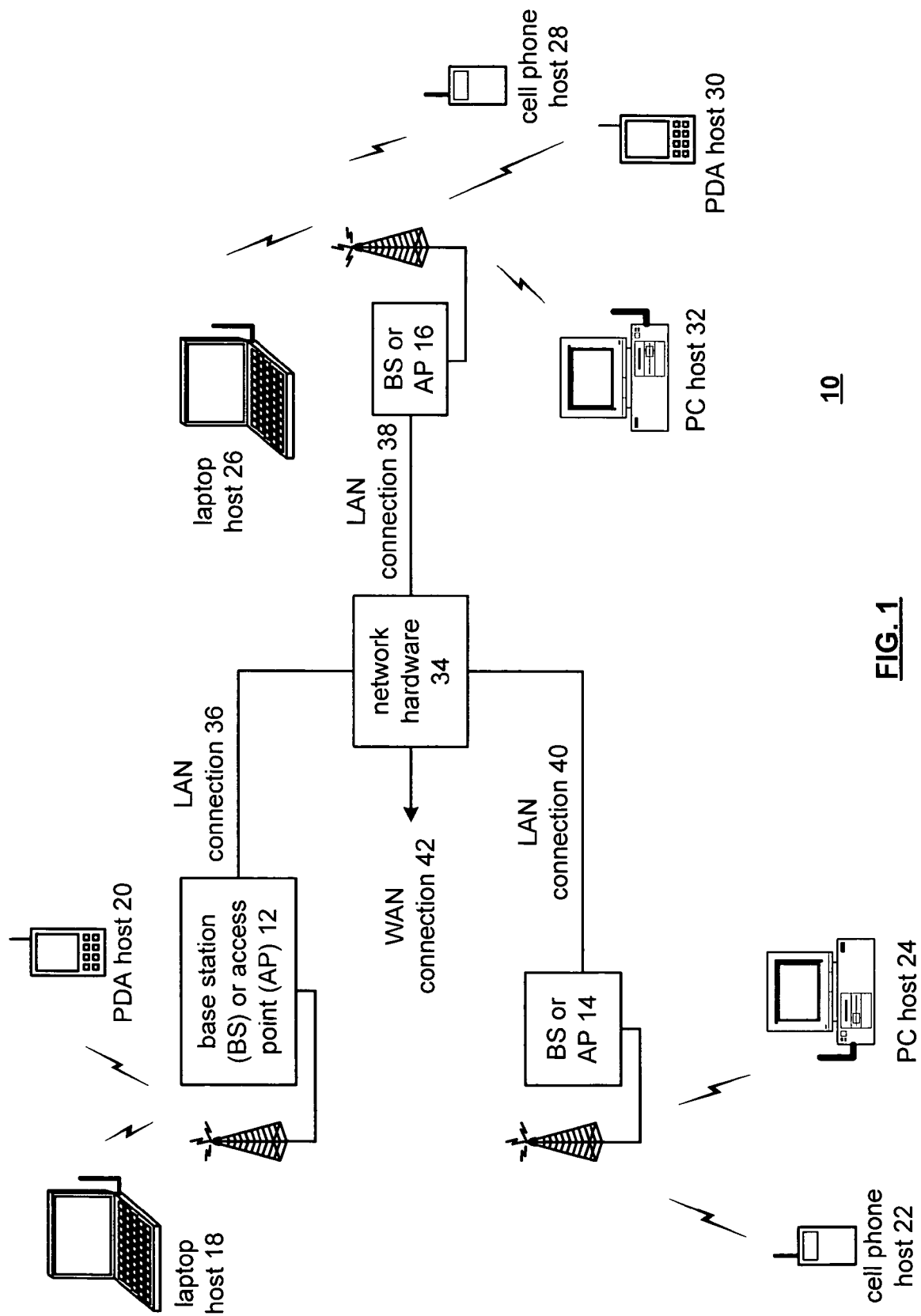
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
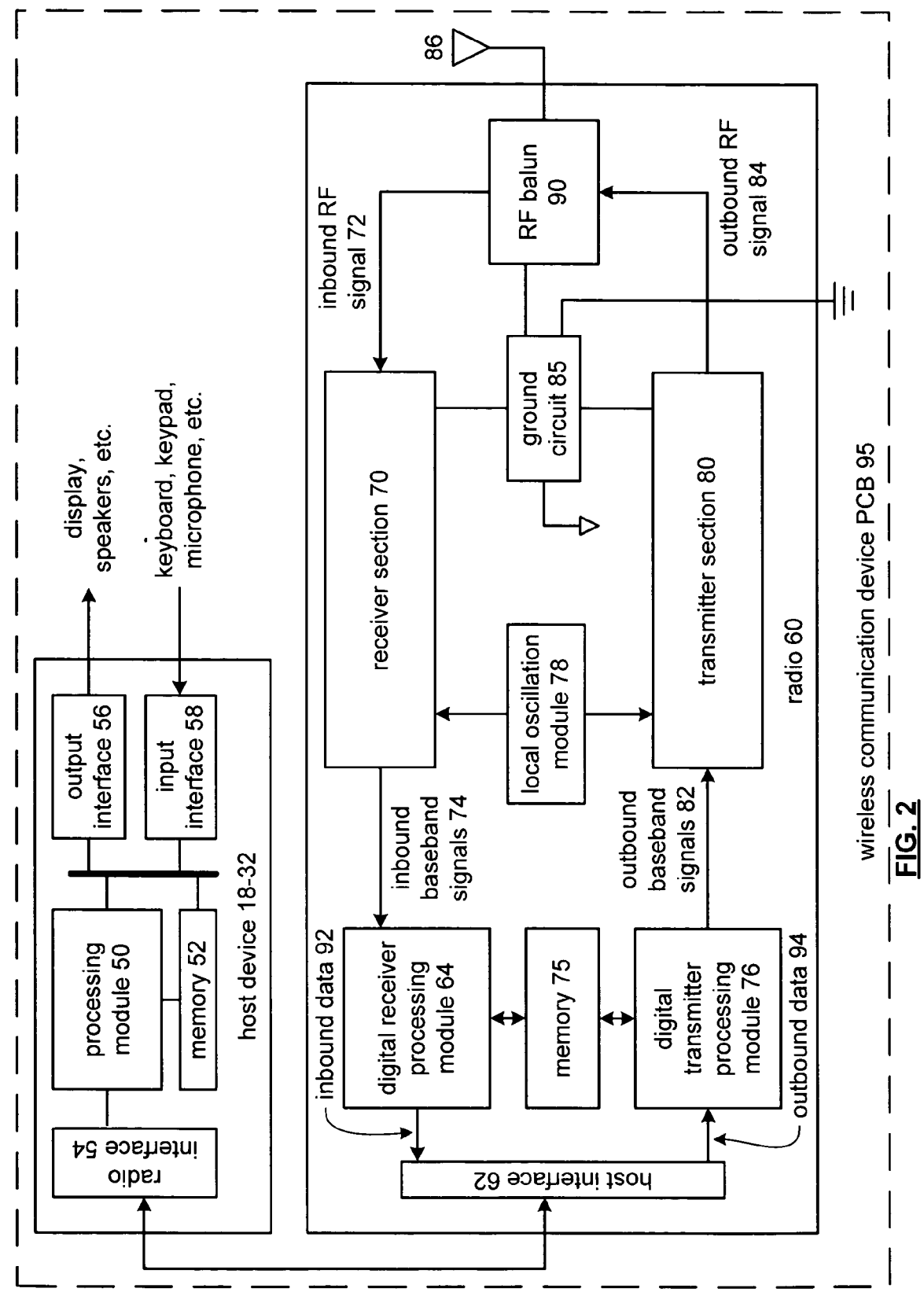
FIG. 2 is a schematic block diagram of a wireless communication device in accordance with the present invention.

FIG. 2 is a schematic block diagram illustrating a wireless communication device that includes the host device 18–32 and an associated radio 60. The radio 60, which may be an implemented on one or more integrated circuits, is mounted on a printed circuit board (PCB) 95, which includes a PCB ground connection. The host device may also be mounted on the PCB 95 or may be on another PCB. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, a receiver section 70, at least one radio frequency (RF) balun 90 (note that may have separate baluns for transmitter and receiver or a shared balun), at least one ground circuit 85, a transmitter section 80, memory 75, a digital transmitter processing module 76, a local oscillation module 78, and an antenna 86. The antenna 86 may be a single antenna that is shared by the transmitter section 80 and receiver section 70 as regulated by the RF balun 90, or may include separate antennas for the transmitter section 80 and the receiver section 70. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce outbound baseband signals 82. The outbound baseband signals 82 may be digital base-band signals or digital low IF signals, where the low IF typically will be in the frequency range of one hundred kilohertz to a few megahertz.

The transceiver section 80, which may include a digital-to-analog converter, a filtering/gain module, an IF mixing up conversion stage, a power amplifier, and a transmitter filter module, converts the outbound baseband signals 82 into outbound RF signals 84. In particular, the digital-to-analog converter converts the outbound baseband signals 82 from the digital domain to the analog domain. The filtering/gain module filters and/or adjusts the gain of the analog baseband or low IF signals prior to providing it to the IF mixing stage. The IF mixing stage converts the analog baseband or low IF signals into RF signals based on a transmitter local oscillation provided by local oscillation module 78. The power amplifier amplifies the RF signals, which are subsequently filtered by the transmitter filter module to produce the outbound RF signals 84. The antenna 86 receives the outbound RF signals 84 from the RF balun 90 and transmits them to a targeted device such as a base station, an access point and/or another wireless communication device.

The radio 60 also receives inbound RF signals 72 via the antenna 86, which were transmitted by a base station, an access point, or another wireless communication device. The antenna 86 provides the inbound RF signals 72 to the RF balun 90, which, in turn, provides the inbound RF signals 72 to the receiver section 70. The receiver section 70, which may include an analog-to-digital converter, a filtering/gain module, an IF mixing down conversion stage, a receiver filter, and a low noise amplifier, converts the inbound RF signals 72 into inbound baseband signals 74. In particular, receiver filter bandpass filters the inbound RF signals 72 and provides the filtered signals to the low noise amplifier 72, which amplifies the signals to produce an amplified inbound RF signals. The low noise amplifier provides the amplified inbound RF signals to the IF mixing module, which directly converts the amplified inbound RF signals into inbound low IF signals or baseband signals based on a receiver local oscillation provided by local oscillation module 78. The down conversion module provides the inbound low IF signals or baseband signals to the filtering/gain module. The filtering/gain module filters and/or adjusts the gain of the inbound low IF signals or the inbound baseband signals to produce filtered inbound signals.

The analog-to-digital converter 66 converts the filtered inbound signals from the analog domain to the digital domain to produce the inbound baseband signals 74. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
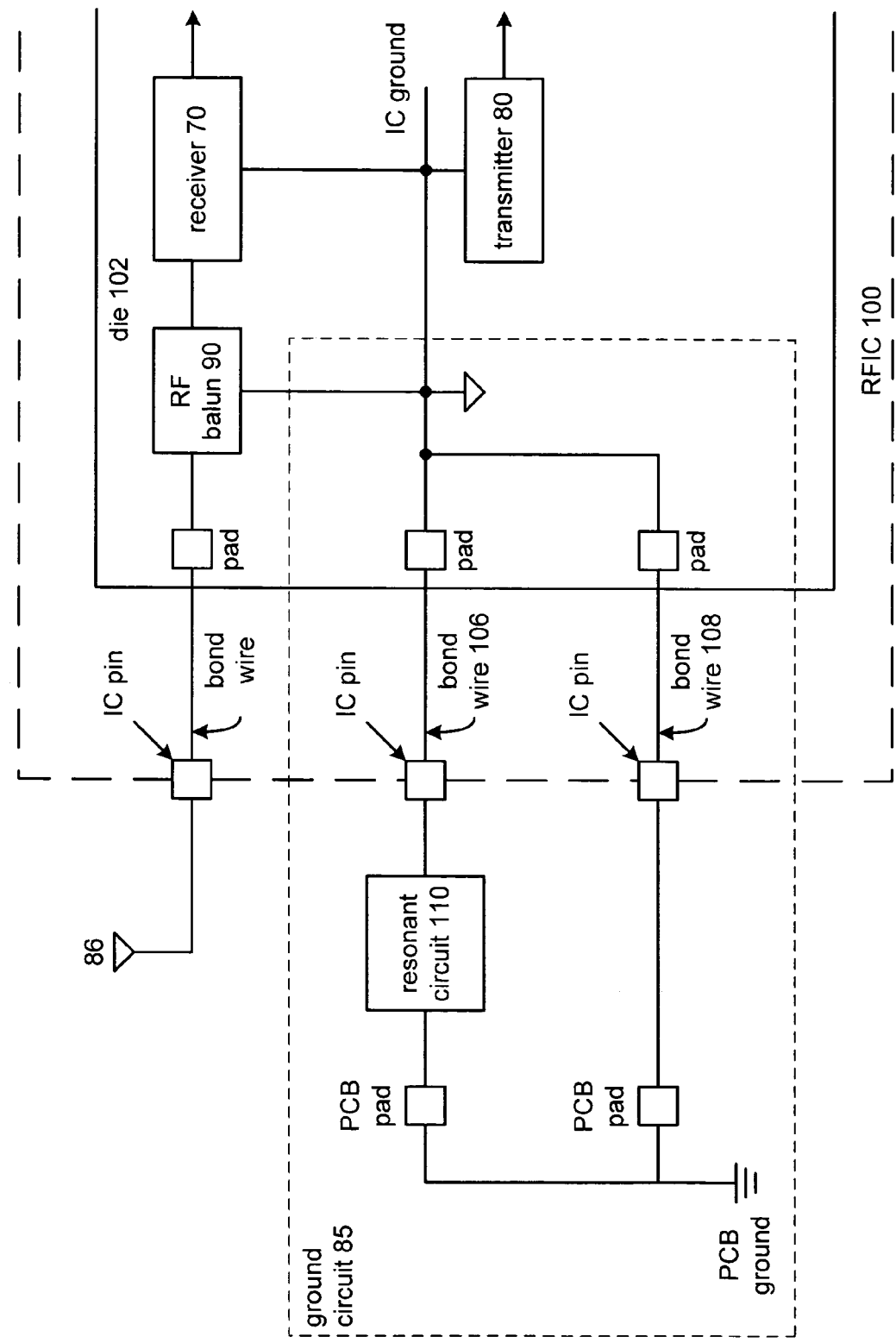
FIG. 3 is a schematic block diagram of a ground circuit in accordance with the present invention.

FIG. 3 is a schematic block diagram of ground circuit 85 that is implemented at least partially within the radio frequency integrated circuit (RFIC) 100, and on the printed circuit board 95. In this embodiment, the radio frequency integrated circuit 100 includes a package that has a plurality of IC pins and a die 102. The die 102 includes a plurality of pads, the RF balun 90, the receiver section 70, the transmitter section 80 and an integrated circuit ground. The printed circuit board (PCB) includes a plurality of PCB pads and a PCB ground. The RFIC 100 and a resonant circuit 110 may be mounted on the printed circuit board. As is further shown, the pads of die 102 are operably coupled to the integrated circuit pins of the package via bond wires 106 and 108.

In this implementation, antenna 86 is operably coupled to an integrated circuit 10 that in turn is coupled to the RF balun 90 via a bond wire and an associated pad on die 102. The IC ground of die 102 is coupled via two paths to the PC ground of the printed circuit board. The $1^{st}$ path includes a pad of die 102, bond wire 106, IC pin, resonant circuit 110 and a PCB pad. The $2^{nd}$ path includes a pad on die 102, bond wire 108, IC pin, a trace on the printed circuit board and a PCB pad.

As configured, the $1^{st}$ path, which includes the resonant circuit 110, provides a low impedance path at a particular range of operating frequencies while the $2^{nd}$ path provides a low impedance ground path at low frequencies. For instance, bond wire 106 will have a particular inductance. The resonant circuit 110 is selected such that it resonates with the bond wire 106 at a desired frequency range. For example, the resonant circuit 110 may be a capacitor that at a particular frequency range (e.g., 2.4 GHz) resonates with the inductance of bond wire 106. By resonating at this frequency, the path of resonant circuit 110 and bond wire 106 has a low impedance at this frequency range.

Figure 4:
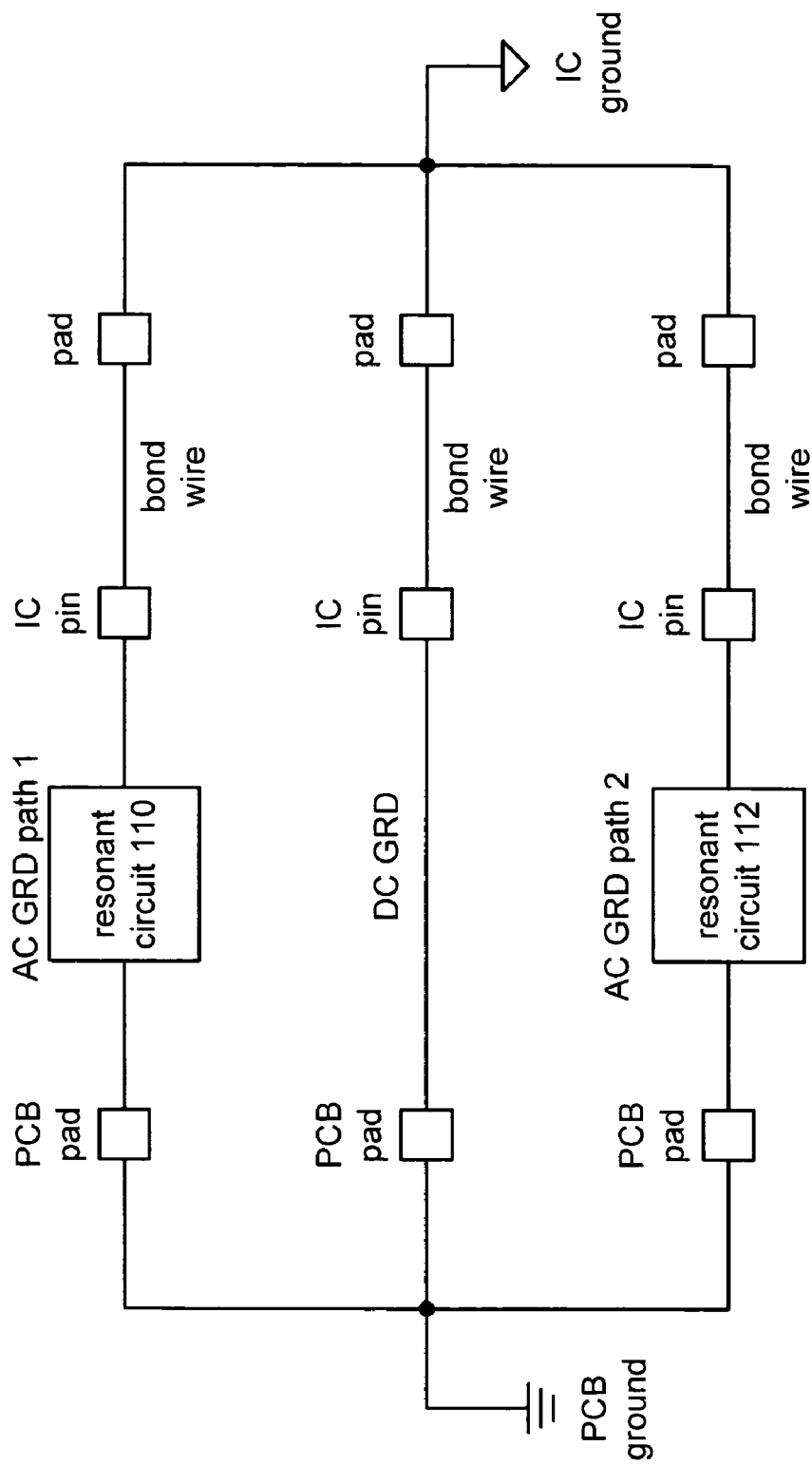
FIG. 4 is a schematic block diagram of another embodiment of a ground circuit in accordance with the present invention.

FIG. 4 is a schematic block diagram of an alternate embodiment of ground circuit 85. In this embodiment, the ground circuit 85 includes a plurality of pads on the die coupled to an IC ground, a plurality of integrated circuit pins, a plurality of bond wires, a $1^{st}$ resonant circuit 110, a $2^{nd}$ resonant circuit 112, a plurality of PCB pads coupled to a PCB ground. In this embodiment, a DC ground path is provided via the direct connection of the IC ground to the PCB ground via the bond wire trace on the printed circuit board as shown in the center path of FIG. 4.

The ground circuit 85 of FIG. 4 also includes a $1^{st}$ AC ground path and a $2^{nd}$ AC ground path. In this embodiment, resonant circuit 110 resonates with the corresponding bond wire at a particular frequency (e.g., 2.4 GHz) while the resonant circuit 112 resonates with its corresponding bond wire at another frequency (e.g., 5.25 GHz). In this embodiment, the resonant circuits 110 and 112 may be capacitors. As one of average skill in the art will appreciate, additional resonant circuits and corresponding bond wires may be added to provide an additional AC ground path that resonates at an alternate frequency (e.g., 900 MHz).

Figure 5:
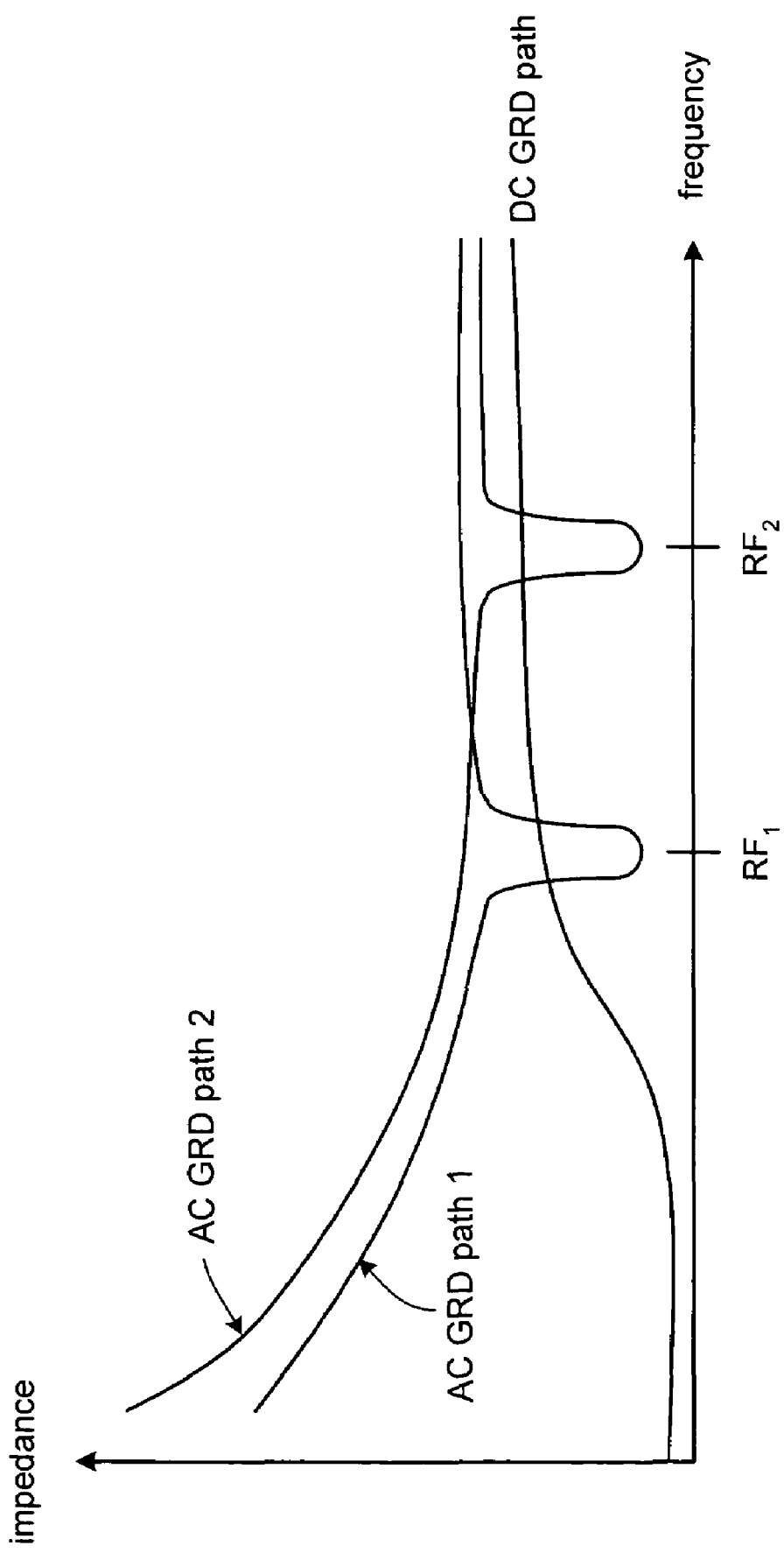
FIG. 5 is an impedance graph of a ground circuit in accordance with the present invention.

FIG. 5 is a graph of the impedance of the DC ground path and the $1^{st}$ and $2^{nd}$ AC ground paths of FIG. 4. As shown, as the frequency increases, the impedance of the DC ground path increases due to the series inductance of the ground path. The impedance of the AC ground path 1 decreases and then at a particular resonant frequency ($RF_1$), provides a low impedance such that a low impedance ground path is provided for signals at and around the resonant frequency $RF_1$. Similarly, the $2^{nd}$ AC ground path provides a low impedance at a $2^{nd}$ resonant frequency ($RF_2$).

Figure 6:
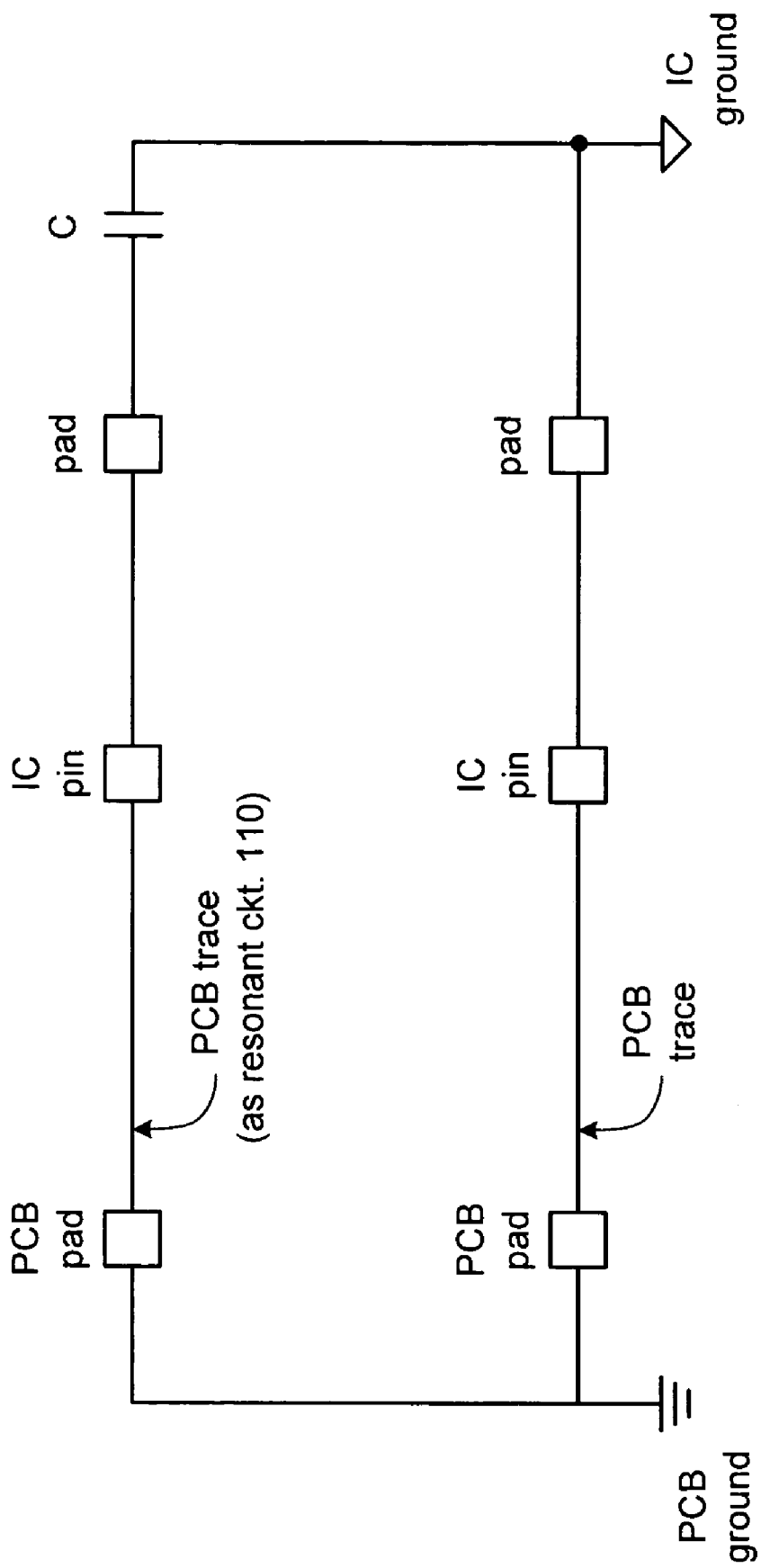
FIG. 6 is a schematic block diagram of yet another embodiment of a ground circuit in accordance with the present invention.

FIG. 6 illustrates another embodiment of a ground circuit 85. In this embodiment, the operable coupling of the IC ground on die 102 to a corresponding die pad is done via a capacitor (C). In this embodiment, the resonant circuit 110 may be a printed circuit board trace. The coupling between the pad and integrated circuit 10 is done via a bond wire. The capacitance of the capacitor C is chosen to resonate with the inductance of bond wire at a particular frequency. The other path between the IC ground and printed circuit board ground provides a low impedance path at low frequencies.

FIG. 7 is a schematic block diagram of yet another embodiment of ground circuit 85. In this embodiment, the IC ground on the die 102 is operably coupled to the PSB ground via a plurality of paths. A $1^{st}$ path includes a low frequency ground coupling circuit 120, a $2^{nd}$ path includes a high frequency ground coupling circuit 102 and a $3^{rd}$ path includes a high frequency coupling ground circuit 124. As one of average skill in the art will appreciate, the ground circuit 85 may include a plurality of high frequency ground coupling circuits. The low frequency ground coupling circuit 120 may include an IC pad coupled to the IC ground, a package pin (IC pin), a bond wire coupling the IC pad to the IC pin, and a printed circuit board trace coupling the IC pin to the PCB ground. The high frequency ground coupling circuits 122 and 124 may include an IC pad coupled to the integrated circuit ground, an IC pin, a bond wire coupling the IC circuit pad to the IC pin, and a resonant circuit coupling the IC pin to the PCB ground, were the resonant circuit and the bond wire produce a resonating circuit at a high frequency band region. In such an embodiment, the resonant circuit may include a capacitor. Alternatively, the high frequency ground coupling circuits 122 and 124 may include an IC pad, a capacitor coupling the IC pad to the IC ground connection, an IC pin, a bond wire coupling the IC pad to the IC pin and a connection circuit coupling the IC pin to the PCB ground connection, when the capacitor, connection circuit, and the bond wire provide a resonating circuit at a high frequency band region. Note that the connection circuit may be a PCB trace or another capacitor.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an integrated circuit grounding system that provides a good ground connection for high frequency signals. As one of average skill in the art will appreciate, other embodiments may be derived from the teaching of the present invention without deviating from the scope of the claims.

What is claimed is:

1. An integrated circuit grounding system comprises:
   an integrated circuit (IC) ground connection fabricated on a substrate of an integrated circuit;
   a first IC package pin operably coupled to the IC ground connection via a first bond wire;
   a second IC package pin operably coupled to the IC ground connection via a second bond wire;
   a first printed circuit board (PCB) pad;
   a second PCB pad operably coupled to the second IC package pin to provide a low impedance DC ground connection for the integrated circuit to the printed circuit board;
   a PCB ground connection operably coupled to the first and second PCB pads; and
   a resonant circuit operably coupling the first IC package pin to the first PCB pad, wherein the resonant circuit is tuned to resonate with the first bond wire at high frequency range to provide a low impedance AC ground connection for the integrated circuit to the printed circuit board within the high frequency range.

2. The integrated circuit grounding system of claim 1, wherein the resonant circuit comprises a capacitor having a capacitance value to resonate with an inductance value of the first bond wire.

3. The integrated circuit grounding system of claim 1 further comprises:
   a third IC package pin operably coupled to the IC ground connection via a third bonding wire;
   a third PCB pad operably coupled to the PCB ground connection; and
   a second resonant circuit operably coupling the third IC package pin to the third PCB pad, wherein the second resonant circuit is to tuned to resonate with the third bond wire at a second high frequency range to provide a second low impedance AC ground connection for the integrated circuit to the printed circuit board within the second high frequency range.

4. The integrated circuit grounding system of claim 1, wherein the operable coupling between the first IC package pin and the IC ground connection comprises a capacitor, wherein the resonant circuit is tuned to resonate with the first bond wire and the capacitor.

5. The integrated circuit grounding system of claim 4, wherein the resonant circuit comprises a low impedance connection.

6. An integrated circuit grounding system comprises:
   an integrated circuit (IC) ground connection on a substrate of an integrated circuit;
   a printed circuit board (PCB) ground connection on a layer of a printed circuit board;
   a first ground coupling circuit providing low impedance coupling of the IC ground connection to the PCB ground connection at low frequencies; and
   a second ground coupling circuit providing low impedance coupling of the IC ground connection to the PCB ground connection at a high frequency band region.

7. The integrated circuit grounding system of claim 6 further comprises:
   a third ground coupling circuit providing low impedance coupling of the IC ground connection to the PCB ground connection at a second high frequency band region; and
   a fourth ground coupling circuit providing low impedance coupling of the IC ground connection to the PCB ground connection at a third high frequency band region.

8. The integrated circuit grounding system of claim 7 further comprises:
   the high frequency band region being centered at approximately 2.4 giga-Hertz (GHz);
   the second high frequency band region being centered at approximately 5.25 GHz; and
   the third high frequency band region being centered at approximately 900 mega-Hertz.

9. The integrated circuit grounding system of claim 6, wherein the first ground coupling circuit comprises:
   an integrated circuit pad coupled to the IC ground connection;
   a package pin;

a bonding wire coupling the integrated circuit pad to the package pin; and
a PCB trace coupling the package pin to the PCB ground connection.

10. The integrated circuit grounding system of claim 6, wherein the second ground coupling circuit comprises:
an integrated circuit pad coupled to the IC ground connection;
a package pin;
a bonding wire coupling the integrated circuit pad to the package pin; and
a resonant circuit coupling the package pin to the PCB ground connection, wherein the resonant circuit and the bonding wire produce a resonating circuit at the high frequency band region.

11. The integrated circuit grounding system of claim 10, wherein the resonant circuit comprises a capacitor.

12. The integrated circuit grounding system of claim 6, wherein the second ground coupling circuit comprises:
an integrated circuit pad;
a capacitor coupling the integrated circuit pad to the IC ground connection;
a package pin;
a bonding wire coupling the integrated circuit pad to the package pin; and
a connection circuit coupling the package pin to the PCB ground connection, wherein the capacitor, the connection circuit, and the bonding wire produce a resonating circuit at the high frequency band region.

13. The integrated circuit grounding system of claim 12, wherein the connection circuit comprises at least one of:
a PCB trace; and
a second capacitor.

14. A wireless communication device comprises:
a receiver section operably coupled to convert inbound radio frequency (RF) signals into inbound baseband signals, wherein the receiver section is part of a radio frequency integrated circuit (RFIC);
a transmitter section operably coupled to convert outbound baseband signals into outbound RF signals, wherein the transmitter section is part of the RFIC;
an RF balun operably coupling an antenna, wherein the RF balun provides the inbound RF signals from the antenna to the receiver section and provides the outbound RF signals from the transmitter section to the antenna, wherein the RF balun is part of the RFIC; and
a ground circuit operably coupling a node of the RF balun to ground, wherein the ground circuit is part of the RFIC and includes:
an integrated circuit (IC) ground connection;
a first IC package pin operably coupled to the IC ground connection via a first bond wire;
a second IC package pin operably coupled to the IC ground connection via a second bond wire;
a first printed circuit board (PCB) pad of the printed circuit board supporting the RFIC;
a second PCB pad operably coupled to the second IC package pin to provide a low impedance DC ground connection for the integrated circuit to the printed circuit board;
a PCB ground connection operably coupled to the first and second PCB pads; and
a resonant circuit operably coupling the first IC package pin to the first PCB pad, wherein the resonant circuit is tuned to resonate with the first bond wire at high frequency range to provide a low impedance AC ground connection for the RFIC to the printed circuit board within the high frequency range.

15. The wireless communication device of claim 14, wherein the resonant circuit comprises a capacitor having a capacitance value to resonate with an inductance value of the first bond wire.

16. The wireless communication device of claim 14, wherein the ground circuit further comprises:
a third IC package pin operably coupled to the IC ground connection via a third bonding wire;
a third PCB pad operably coupled to the PCB ground connection; and
a second resonant circuit operably coupling the third IC package pin to the third PCB pad, wherein the second resonant circuit is to tuned to resonate with the third bond wire at a second high frequency range to provide a second low impedance AC ground connection for the RFIC to the printed circuit board within the second high frequency range.

17. The wireless communication device of claim 14, wherein the operable coupling between the first IC package pin and the IC ground connection comprises a capacitor, wherein the resonant circuit is tuned to resonate with the first bond wire and the capacitor.

18. The wireless communication device of claim 17, wherein the resonant circuit comprises a low impedance connection.

19. A wireless communication device comprises:
a receiver section operably coupled to convert inbound radio frequency (RF) signals into inbound baseband signals, wherein the receiver section is part of a radio frequency integrated circuit (RFIC);
a transmitter section operably coupled to convert outbound baseband signals into outbound RF signals, wherein the transmitter section is part of the RFIC;
an RF balun operably coupling an antenna, wherein the RF balun provides the inbound RF signals from the antenna to the receiver section and provides the outbound RF signals from the transmitter section to the antenna, wherein the RF balun is part of the RFIC; and
a ground circuit operably coupling a node of the RF balun to ground, wherein the ground circuit is part of the RFIC and includes:
an integrated circuit (IC) ground connection;
a printed circuit board (PCB) ground connection on a layer of a printed circuit board supporting the RFIC;
a first ground coupling circuit providing low impedance coupling of the IC ground connection to the PCB ground connection at low frequencies; and
a second ground coupling circuit providing low impedance coupling of the IC ground connection to the PCB ground connection at a high frequency band region.

20. The wireless communication device of claim 19, wherein the ground circuit further comprises:
a third ground coupling circuit providing low impedance coupling of the IC ground connection to the PCB ground connection at a second high frequency band region; and
a fourth ground coupling circuit providing low impedance coupling of the IC ground connection to the PCB ground connection at a third high frequency band region.

21. The wireless communication device of claim 20 further comprises:
the high frequency band region being centered at approximately 2.4 giga-Hertz (GHz);

the second high frequency band region being centered at approximately 5.25 GHz; and the third high frequency band region being centered at approximately 900 mega-Hertz.

22. The wireless communication device of claim 19, wherein the first ground coupling circuit comprises:
   an integrated circuit pad coupled to the IC ground connection;
   a package pin;
   a bonding wire coupling the integrated circuit pad to the package pin; and
   a PCB trace coupling the package pin to the PCB ground connection.

23. The wireless communication device of claim 19, wherein the second ground coupling circuit comprises:
   an integrated circuit pad coupled to the IC ground connection;
   a package pin;
   a bonding wire coupling the integrated circuit pad to the package pin; and
   a resonant circuit coupling the package pin to the PCB ground connection, wherein the resonant circuit and the bonding wire produce a resonating circuit at the high frequency band region.

24. The wireless communication device of claim 23, wherein the resonant circuit comprises a capacitor.

25. The wireless communication device of claim 19, wherein the second ground coupling circuit comprises:
   an integrated circuit pad;
   a capacitor coupling the integrated circuit pad to the IC ground connection;
   a package pin;
   a bonding wire coupling the integrated circuit pad to the package pin; and
   a connection circuit coupling the package pin to the PCB ground connection, wherein the capacitor, the connection circuit, and the bonding wire produce a resonating circuit at the high frequency band region.

26. The wireless communication device of claim 25, wherein the connection circuit comprises at least one of:
   a PCB trace; and
   a second capacitor.

* * * * *